(12) United States Patent
Hurrell et al.

(10) Patent No.: US 10,826,519 B1
(45) Date of Patent: Nov. 3, 2020

(54) LOWER POWER REFERENCE FOR AN ANALOG TO DIGITAL CONVERTER

(71) Applicant: Analog Devices International Unlimited Company, Limerick (IE)

(72) Inventors: Christopher Peter Hurrell, Cookham (GB); Rares Andrei Bodnar, Berkshire (GB)

(73) Assignee: Analog Devices International Unlimited Company, Limerick (IE)

(*) Notice: Subject to any disclaimer, the term of this patent is extended or adjusted under 35 U.S.C. 154(b) by 0 days.

(21) Appl. No.: 16/552,610

(22) Filed: Aug. 27, 2019

(51) Int. Cl.
 *H03M 1/38* (2006.01)
 *H03M 1/46* (2006.01)

(52) U.S. Cl.
 CPC ..................... *H03M 1/46* (2013.01)

(58) Field of Classification Search
 CPC ............................. H03M 1/46; H03M 1/466
 USPC ................. 341/144, 155, 122, 161
 See application file for complete search history.

(56) References Cited

U.S. PATENT DOCUMENTS

| | | | | |
|---|---|---|---|---|
| 5,781,000 A * | 7/1998 | Saeki | ..................... | H02M 3/156 323/234 |
| 6,515,880 B1 * | 2/2003 | Evans | ..................... | H02M 1/36 363/49 |
| 8,552,897 B1 * | 10/2013 | Hurrell | ..................... | H03F 3/45 341/136 |
| 10,101,410 B2 * | 10/2018 | Latham | .............. | G01R 33/0023 |
| 2007/0296478 A1 * | 12/2007 | Alfano | ..................... | G06F 1/08 327/274 |
| 2015/0042500 A1 * | 2/2015 | Fujiwara | ................. | H03M 1/46 341/155 |

* cited by examiner

*Primary Examiner* — Peguy Jean Pierre
(74) *Attorney, Agent, or Firm* — Schwegman Lundberg & Woessner, P.A.

(57) ABSTRACT

The present disclosure provides alternative solutions to the problem of providing a stable voltage reference to high speed ADCs that possess high sampling rates. In one example the high speed amplifier is replaced by a smaller, slower, lower power amplifier in combination with a relatively large capacitor connected to the same node as the amplifier output and the ADC reference input. The capacitor is charged substantially to the external reference voltage and hence keeps the reference input of the ADC almost at the external reference voltage between conversions, such that when conversion is about to occur and the external reference is switched in then very little charge is required from the external reference, and hence the reference signal quickly settles. An alternative arrangement is to replace the amplifier with a comparator that takes as one of its inputs the external reference signal, and as the other of its inputs the internal reference to the ADC, and makes use of a control circuit that adjusts the threshold of the comparator from bit-trial to bit-trial until the internal reference is brought up to substantially the same signal level as the external reference. When the external reference is then switched in to supply the ADC circuit it settles very quickly and draws very little power therefrom.

27 Claims, 16 Drawing Sheets

US 10,826,519 B1

LOWER POWER REFERENCE FOR AN ANALOG TO DIGITAL CONVERTER

FIELD OF THE DISCLOSURE

The disclosure relates to arrangements for providing a voltage reference that may be used as a reference signal in an analog to digital converter, for example a pipeline SAR analog to digital converter, the reference having lower power requirements than existing arrangements.

BACKGROUND

Analog to digital converters require accurate voltage references for accurate conversions to occur. Off-chip voltage reference sources are often used to provide temperature compensated voltage references, but circuitry is usually required on chip to isolate the accurate but slow settling off-chip reference from the dynamic loading of the ADC reference and to ensure that the ADC reference settles to a sufficient accuracy during each conversion. As ADC conversion rates increase, and ADC architectures become more complicated to support higher conversion rates, the need to provide a settled and stable reference signal for each conversion becomes more challenging.

SUMMARY OF THE DISCLOSURE

One approach is to use a fast, wide bandwidth on-chip amplifier to drive the reference input to the ADC to the same level as the external reference such that very little charge is then taken from the external reference, but the use of such an amplifier has trade-offs in terms of high power.

The present disclosure provides alternative solutions to the problem of providing a stable voltage reference to high speed ADCs that possess high sampling rates. In particular, in one example the high-speed amplifier may be replaced by a slower, lower power amplifier in combination with a relatively large capacitor connected to the same node as the amplifier output and connectable to the ADC reference input. The capacitor is charged substantially to the external reference voltage, and keeps the reference input of the ADC at or almost at the reference voltage, such that when a phase of the conversion when an accurate reference is required is about to occur and the external reference is switched in for use during that phase (and the capacitor is disconnected from the ADC reference input), then very little charge is required from the external reference, and hence the reference signal quickly settles. The slow amplifier can then re-charge any charge taken from the reference capacitor to restore the capacitor substantially to the reference voltage. Such an arrangement provides a simple solution, and simplifies the design of the amplifier that may be used, in that it may be of lower bandwidth and lower power than the case where the amplifier is being used by itself, but it requires the presence of the additional capacitor which is switchable to the reference input to the ADC.

An alternative arrangement also described herein is to replace the amplifier with a comparator controlling a switch between a voltage supply and the ADC reference input, the comparator taking as one of its inputs the external reference signal, and as the other of its inputs the internal reference to the ADC, and makes use of a control circuit that adjusts the threshold of the comparator from bit-trial to bit-trial, the comparator output controlling the switch to supply current from the voltage supply until the internal reference is brought up to substantially the same signal level as the external reference. When the external reference is then switched in to supply the ADC circuit it then settles very quickly and draws very little power therefrom. This solution does not require any additional capacitor, and hence is applicable where chip space and/or access to outlet pins is more limited than the solution described above using the additional capacitor.

In view of the above, from one aspect the present disclosure provides an integrated voltage reference supply circuit for an analog to digital converter (ADC), the voltage reference supply circuit comprising: an input node that in use receives a voltage reference signal Vref; a comparator (Comp1) receiving Vref at a first one of its signal inputs and an internal voltage reference signal Vref_internal present at a reference input of a DAC forming part of the analog to digital converter at a second one of its signal inputs, the comparator being further arranged to output a difference control signal in dependence on a difference between Vref and the internal voltage reference signal Vref_internal; a controllable switch (MP1) receiving the difference control signal and switching charge to Vref_internal from (Vdd) in dependence thereon; and switching circuitry (S1) arranged to switch selectively the Vref_internal node to the input node to directly receive the voltage reference signal Vref; wherein prior to an operating phase of the ADC that requires a reference signal at the reference input the switching circuitry (S1) is firstly operated during a first phase of operation so as to disconnect the Vref_internal node from the reference signal Vref, and the comparator measures any difference between the voltages on Vref_internal and Vref and controls the controllable switch to supply charge to the Vref_internal node to bring it towards Vref, and then secondly the switch circuitry is operated during a second phase of operation after the first phase to connect the Vref_internal node to the input node to receive the external voltage reference signal Vref so that the Vref_internal node is brought finally to Vref for use as a reference signal by the ADC.

From another aspect, different examples of the present disclosure also provide an integrated voltage reference supply circuit for a high speed analog to digital converter (ADC), the voltage reference supply circuit comprising: an input node that in use receives an external voltage reference signal Vref; a battery capacitor; connected to the output of the low-bandwidth amplifier; a low-bandwidth amplifier (Amp1) receiving the external voltage reference signal Vref at a first one of its signal inputs and to supply the Vref signal to a reference input of the analog-to-digital converter and battery capacitor; switching circuitry (S1, S2) arranged to switch selectively the Vref_internal node to between the input node to directly receive the external voltage reference signal Vref instead of via the low-bandwidth amplifier and battery capacitor; and a battery capacitor connected to the output of the low-bandwidth amplifier; wherein prior to an operating phase of the ADC that requires a reference signal at the reference input the switching circuitry (S1, S2) is firstly operated during a first phase of operation so as to disconnect the Vref_internal node from the external reference signal Vref and connect it to the output node of the amplifier and battery capacitor whereby the low bandwidth amplifier and battery capacitor supplies charge to the Vref_internal node to bring it towards or maintain it at Vref, and then secondly the switching circuitry (S1, S2) is operated during a second phase of operation after the first phase to connect the Vref_internal node to the input node to receive the external voltage reference signal Vref directly, and to disconnect the amplifier and battery capacitor from the Vref_internal node, wherein the amplifier then recharges the battery capacitor back towards Vref.

Moreover, another aspect of the present disclosure also provides a method of providing a voltage reference signal for an analog to digital converter (ADC), the method comprising: receiving an external voltage reference signal Vref; comparing the external voltage reference signal Vref with an internal voltage reference signal Vref_internal present at a reference input of a DAC of the analog to digital converter, and generating a difference control signal in dependence on a difference between Vref and the internal voltage reference signal Vref_internal, provided the difference is greater than a comparison threshold voltage receiving the difference control signal at a controllable switch and supplying the reference input with charge from a voltage supply rail (Vdd) in dependence thereon to bring the Vref_internal reference signal at the reference input node towards Vref; wherein the comparing and generating are subject to a time delay therebetween such that the difference control signal continues to be output for a finite time after the difference becomes equal to or less than the comparison threshold voltage, the comparison threshold voltage being set a finite amount less than the external voltage reference signal in dependence on the finite time such that the Vref_internal reference signal is brought substantially to Vref.

Further features, examples, and advantages of the present disclosure will be apparent from the following description and from the appended claims.

BRIEF DESCRIPTION OF THE DRAWINGS

Examples of the present disclosure will now be described with reference to the accompanying drawings, wherein like reference numerals refer to like parts, and wherein:—

DETAILED DESCRIPTION

Figure 1:
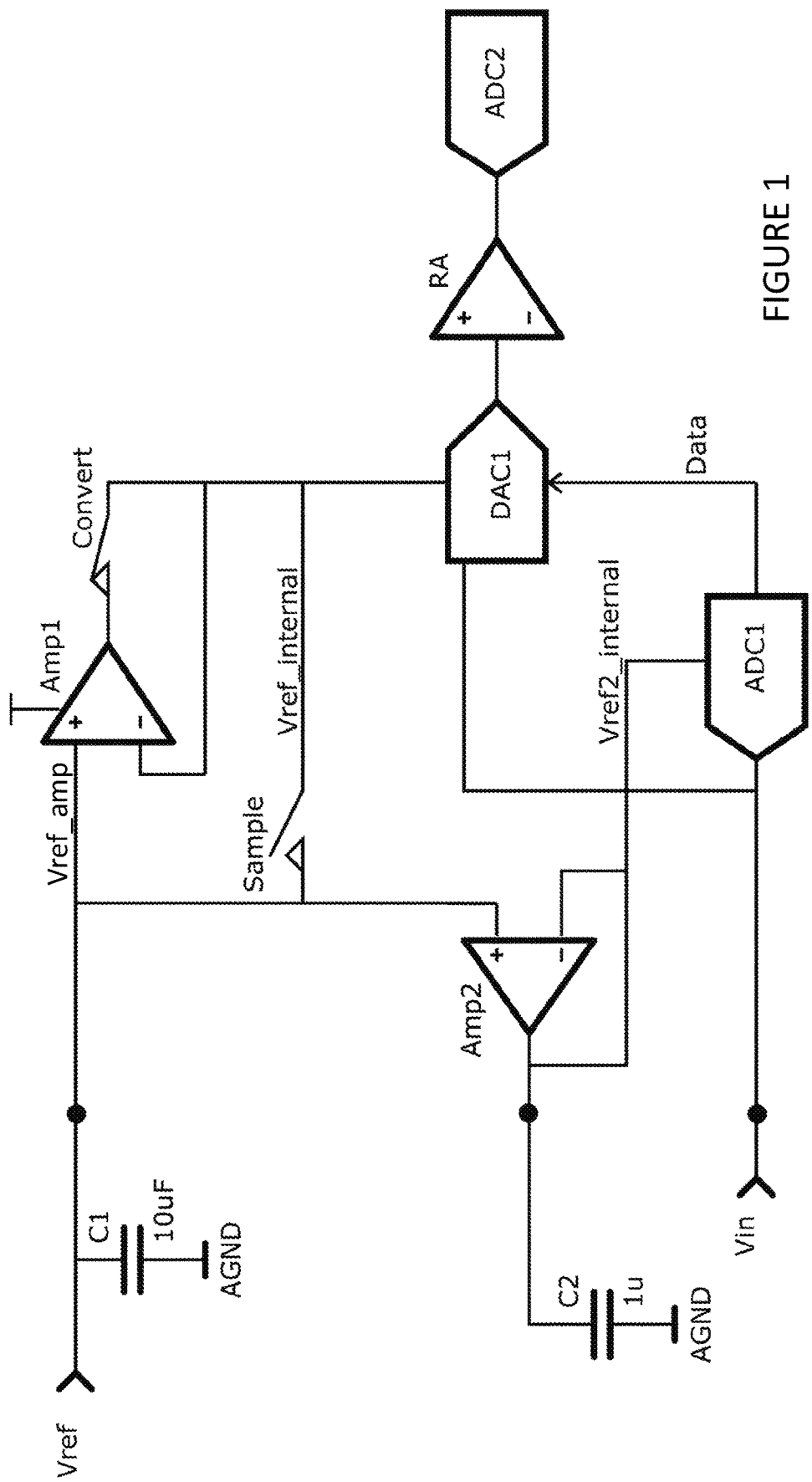
FIG. 1 is a diagram of a pipeline SAR converter that forms the basis of examples of the present disclosure.

Analog to digital converters (ADCs) require accurate references for proper signal conversion. As the sample rates of ADCs increase then for some ADC architectures where the reference signal is not constant, the ability to provide a settled reference signal from an external temperature compensated reference circuit is challenged, as there is often insufficient time to switch in the external reference and have it settle to the proper reference value between conversions.

This problem can be particularly exacerbated when using some pipeline SAR converter architectures, wherein low resolution conversion of a number of the most significant bits is used to generate the majority of the digital output, but very fast bit trials are then used to obtain accurate conversion for the least significant bits that define the overall conversion accuracy. In such converter architectures the reference voltage to the pipeline ADC is required to settle very quickly, and much more quickly than would be possible by supply of the reference directly from the external reference.

In order to allow for fast settling of the signal, our prior co-pending U.S. patent application Ser. No. 15/916,009 describes how a fast amplifier may be used during the more significant and earlier bit trials to drive the internal reference to the same voltage as the external reference. During subsequent conversion of the less significant bits, the ADC reference is isolated from this fast buffer and instead driven directly by the external reference. Since the conversion of the less significant bits draws very little charge from the reference, the external reference is not significantly perturbed during this phase of the conversion and accurate conversion can be achieved. However, such an arrangement requires a complicated fast amplifier that takes up excessive chip space and consumes lots of power to operate. To reduce power consumption of the whole converter circuit it would be advantageous to replace this amplifier with an alternative, more power efficient arrangement.

The present disclosure describes two arrangements that address this issue. In the simplest arrangements, shown in FIG. 13, 15, or 16, a low-bandwidth and hence slow amplifier, stabilized by a necessarily large off-chip capacitor at its output, in the 100 nF range, is used to replace the high power fast amplifier. The capacitor is connectable by a switch to the internal reference node that feeds the reference of the ADC. The capacitor is charged in use to substantially the same voltage as the external reference voltage, and is used to keep the internal reference substantially at the desired external reference voltage from bit-trial to bit-trial. The internal reference is switched from the capacitor to the external reference at the beginning of each residue generation phase. This provides a simple arrangement to ensure that the internal reference is kept substantially at or near the external reference from bit trial to bit trial and that very little perturbing charge is taken from the slow settling but accurate external reference.

In the second arrangement, described in the other Figures, no additional capacitor is needed, and instead the high speed amplifier is replaced by a transistor switch between a supply voltage and the internal reference and a comparator. The comparator receives as one input the external reference, and as its other input the internal reference, and controls the transistor switch to bring the internal reference close to the external reference. The use of the comparator and transistor switch is more power efficient than the fast amplifier, but suffers from comparator delay, and potential overshoot which can limit the accuracy of this arrangement. In order to address these issues, a comparator threshold adjustment circuit is used to adjust the comparator threshold over a number of conversion cycles to reduce any errors between the comparator output providing the internal reference and the external reference. Usually the system is able to settle within 5 or 6 conversion cycles. The comparator threshold adjustment circuit acts to integrate the error between the internal reference and the external reference from cycle to cycle and adjusts the comparator threshold from cycle to cycle to try and drive the error to zero.

FIG. 1 illustrates the pipeline successive approximation (SAR) converter architecture that forms the background of the present disclosure. Here, the ADC converter comprises analog to digital converter ADC1 that receives the signal to be converted from input node Vin. ADC1 performs a relatively low resolution conversion using an internal reference Vref2_internal, that is derived from the accurate external reference Vref via amplifier Amp2. Amp2 can be a slow, relatively inaccurate amplifier, as the conversion performed by ADC1 does not require a highly accurate reference input. ADC1 feeds its converted data to digital to analog converter DAC1, which also receives Vin. DAC1 outputs a residue signal to residue amplifier RA, which outputs an amplified residue signal to analog to digital converter ADC2 to complete the conversion. The full operation of the pipeline SAR converter described above is not needed for the purposes of understanding the present disclosure, although its operation can be found in U.S. Ser. No. 15/916,009 referenced earlier. For the purposes of the present disclosure, however, it is necessary to appreciate that in order to operate correctly and produce accurate conversions that DAC1 does require an accurate reference input while DAC1 is being loaded from ADC1.

In the arrangement of FIG. 1, the reference input to DAC1 is provided by a further internal reference signal Vref_internal, which is derived from the accurate, temperature compensated external (i.e. off-chip) reference Vref, in the following manner. The voltage reference source provides an accurate reference signal Vref to an input pin, to which is also connected a large (10 uF) stabilizing capacitor C1, which is therefore charged to Vref. A high bandwidth fast amplifier Amp1 is further provided, having its non-inverting input connected to the input pin to which Vref is supplied. Its output is connected via a first "convert" switch to the reference input node of DAC1, on which is provided Vref_internal. The inverting input of Amp1 is also connected to this same node i.e. the Vref_internal node (although it can instead be connected directly to the amplifier output). The Vref_internal node is further connected by a second "sample" switch to the input pin to which Vref is supplied. The "sample" and "convert" switches will usually operate in anti-phase i.e. when one is turned on (closed), the other is turned off (opened).

The operation of the above circuit is as follows. Prior to residue generation by the ADC (DAC1), the "convert" switch is closed and the "sample" switch is opened. The amplifier AMP1 operates to try and maintain the Vref_internal node at the same voltage as the Vref node while the changing Data values on the DAC1 inputs cause large charges to be drawn from Vref_Internal. Just prior to residue generation the "convert" switch is opened and the "sample" switch is closed, to allow the external reference Vref to be fed to DAC1. However, because Amp1 has been keeping Vref_internal very close to Vref, very little current needs to be drawn from Vref or C1, and hence Vref experiences little disturbance, thus permitting high sampling rates.

As noted above, however, in order to provide such operation, Amp1 must have wide bandwidth and fast operation, and hence consumes significant power. Lower power solutions are therefore desirable, particularly for mobile applications.

To address this issue a different circuit can be used, which makes use of a comparator and switch to replace the high speed amplifier. The structure of this circuit will be described next, followed by its operation.

Figure 2:
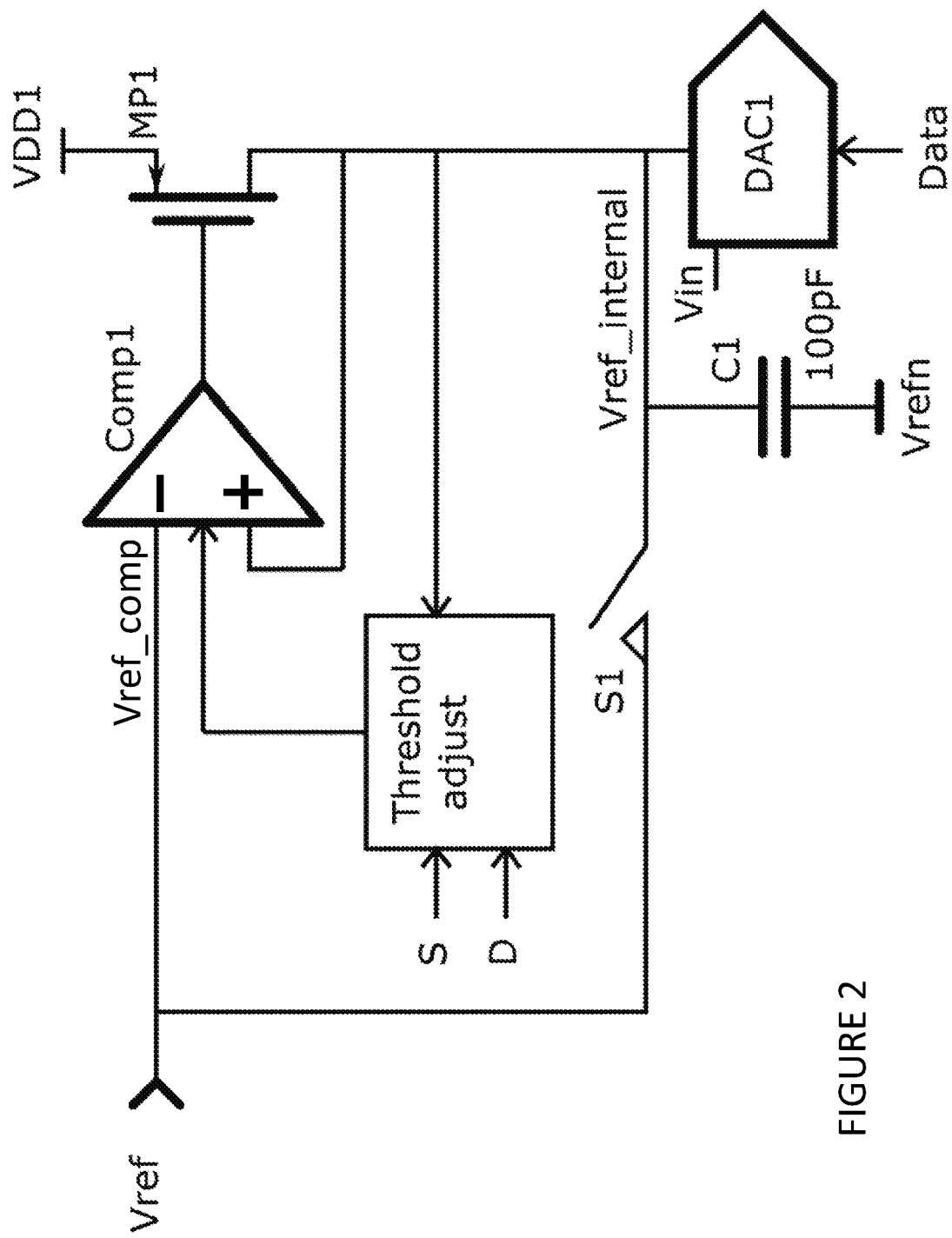
FIG. 2 is a diagram of a comparator circuit that can be used in place of the fast amplifier of FIG. 1 in a first example of the present disclosure.

FIG. 2 illustrates a comparator and switch circuit that can be used to replace the high speed amplifier Amp1 in some examples of the disclosure. Here a comparator Comp1 is provided, which has its inverting input connected to the Vref node, to which in use the stable external reference signal is applied. As in the circuit of FIG. 1, Vref is also supplied via sample switch S1 to the reference input of digital to analog converter DAC1, which forms part of the pipeline SAR converter (the remainder of the converter circuit is not shown, but would be the same as described previously in FIG. 1). A large 100 pF capacitor (C1) is also connected between the DAC1 reference input and an internal node Vrefn. The purpose of this capacitor is to make the job of loading the DAC very simple, as it avoids the risk of top plate nodes going outside the rails. The large capacitor also makes the capacitance on Vref_internal almost constant, which is useful in order to obtain full accuracy of the technique.

Figure 3:
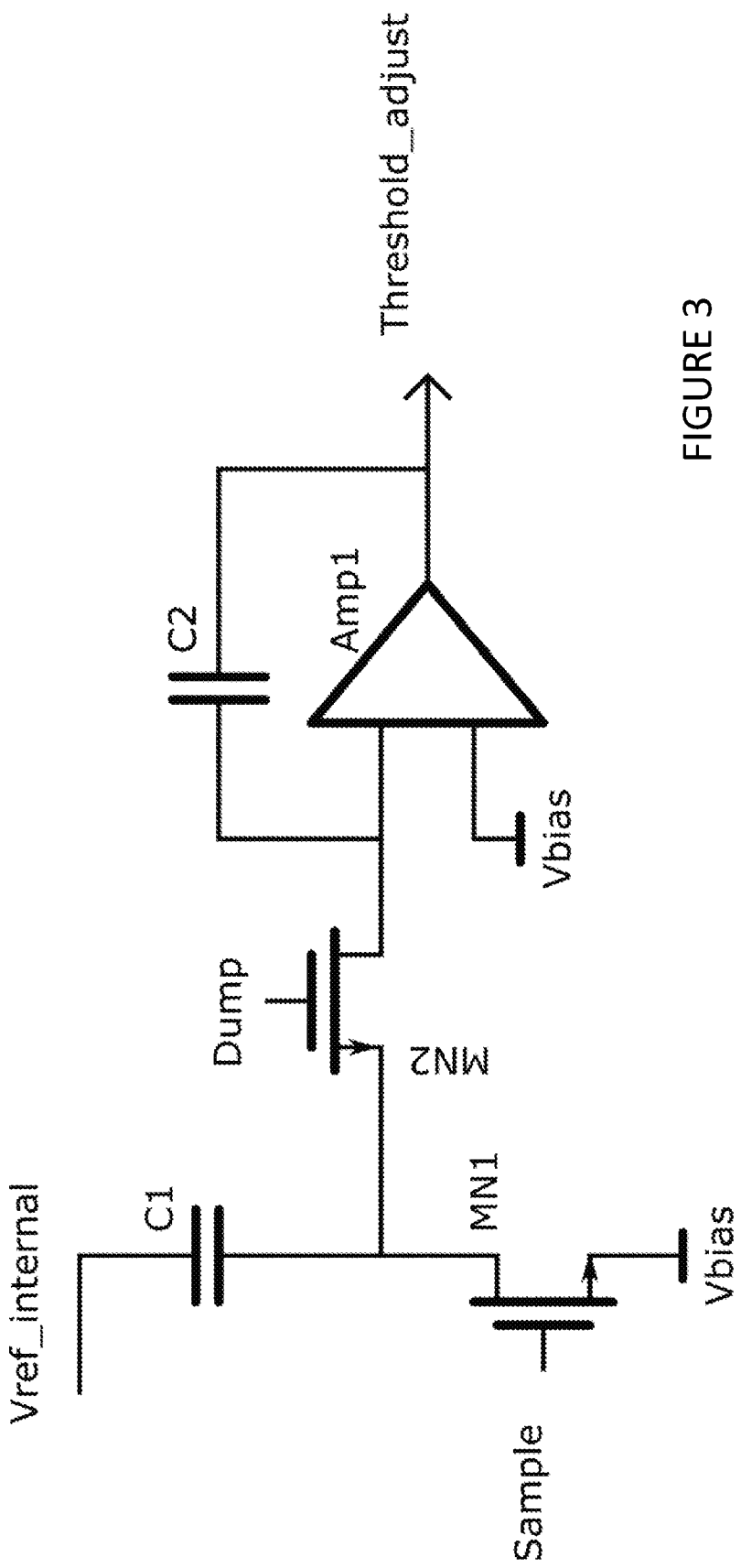
FIG. 3 is a circuit diagram of a circuit that may be used as the threshold adjust block of FIG. 2 that may be used in the first example of the disclosure.

The output of the comparator is fed to the gate of a transistor MP1, which has its drain and source terminals connected between a supply voltage VDD1 and the reference input of DAC1. The reference input node of DAC1 is also connected to the non-inverting input of the comparator. The supply VDD1 is higher than Vref. Finally, a threshold adjust block, described further below with respect to FIG. 3, is provided, that receives as an input the signal on the DAC1 reference input node, as well as control signals "sample" (S) and "dump" (D), and acts to output a threshold control signal to the comparator. The comparator circuitry is shown in more detail in FIGS. 4 and 5.

FIG. 3 illustrates in more detail the internal circuitry within the Threshold Adjust block of FIG. 2. Here, the Vref_internal signal taken from the reference input node of DAC1 is fed via a capacitor C1 to two switches MN1 and MN2, which are respective transistors controlled to be on or off by respective "sample" (for MN1) and "dump" (for MN2) control signals fed to their gates. MN1 is connected between the bottom plate of C1 and a Vbias node at which a bias voltage is provided. MN2 is connected between the bottom plate of C1 and an inverting input of an amplifier Amp1. The non-inverting input of Amp1 is connected to Vbias. A second capacitor C2 provides a feedback loop from the output of the amplifier to the inverting input. The output of the amplifier provides the "Threshold_adjust" control signal that is fed to the threshold control input of comparator Comp1 of FIG. 2.

Figure 4:
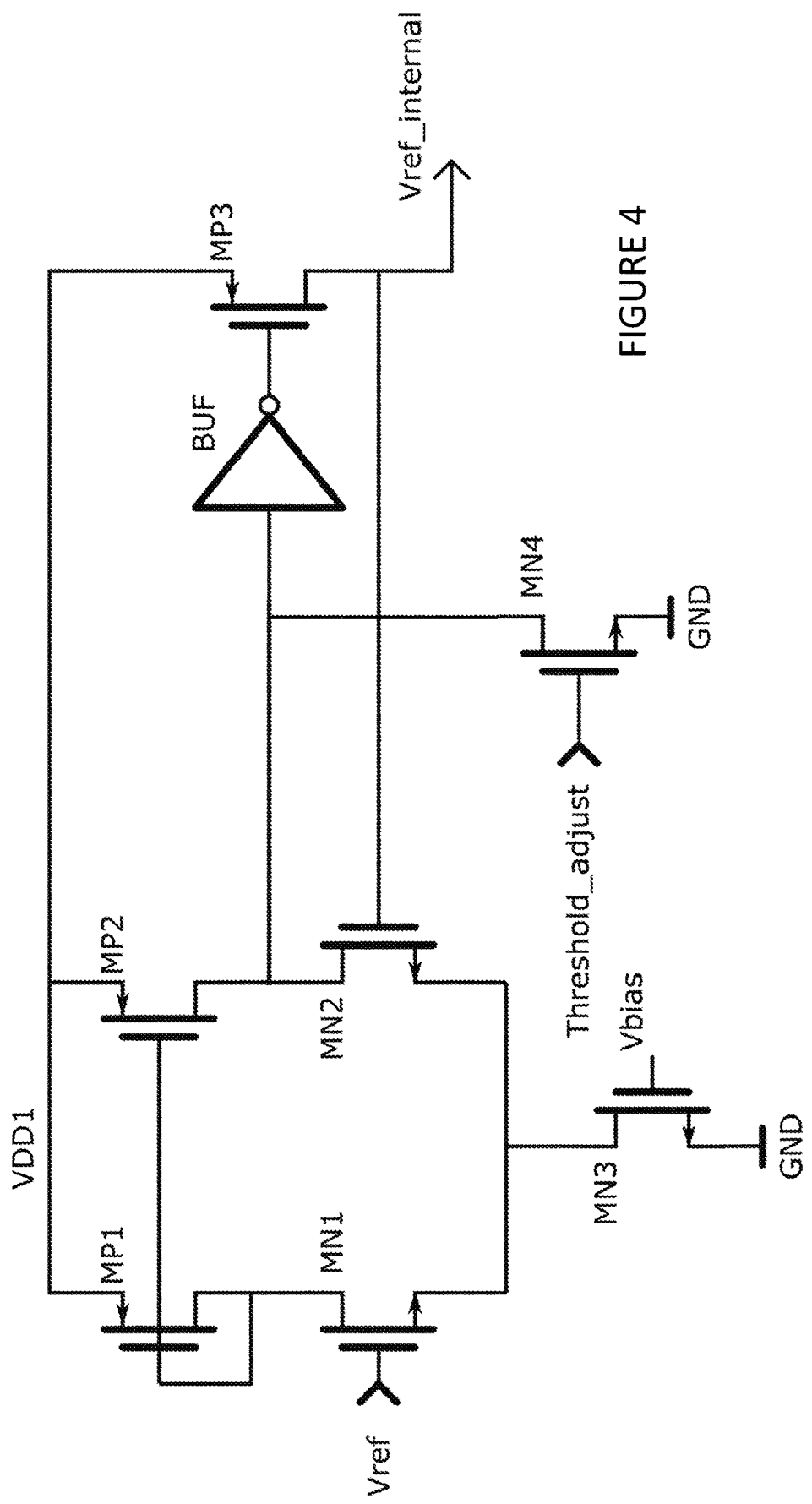
FIG. 4 is a circuit diagram of a comparator circuit that may be used in the first example.
Figure 5:
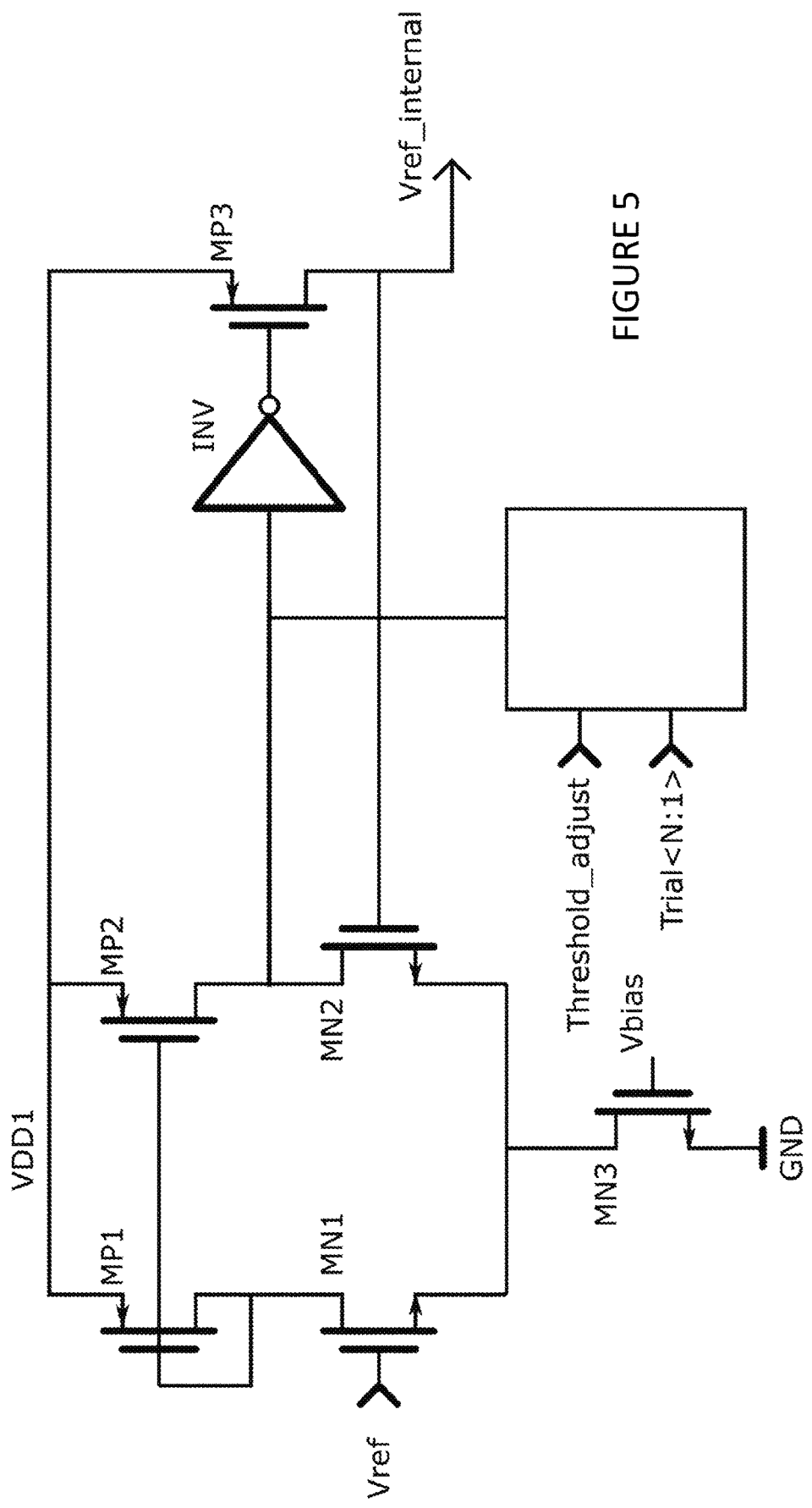
FIG. 5 is a circuit diagram of a second comparator circuit that may be used in the first example, that permits programmable thresholds per bit trial.

FIGS. 4 and 5 show an example long tailed pair differential amplifier that can be used as the comparator Comp1. The long tailed pair differential amplifier arrangement is provided with the "Threshold_adjust" signal via transistor MN4, which skews the threshold of the comparator to adjust the threshold. In more detail, the long tailed pair comprises two pairs of transistors MP1 and MP2, and MN1 and MN2, with MP1 and MN1 connected in series with each other, and MP2 and MN2 connected in series, with the gates of MP1 and MP2 being commonly connected to the drain of MP1. The Vref signal is input to the gate of MN1, and the Vref_internal signal at the reference input to DAC1 is connected to the gate of MN2. The source terminals of MN1 and MN2 are connected together and connect to the GND terminal via the "long-tail" transistor MN3, the gate of which receives a biasing voltage Vbias. The output of the differential amplifier is taken from the node connecting MP2 and MN2, and is fed via an inverting amplifier BUF to the gate of a further transistor MP3, which is the same as transistor switch MP1 of FIG. 2.

Figure 7:
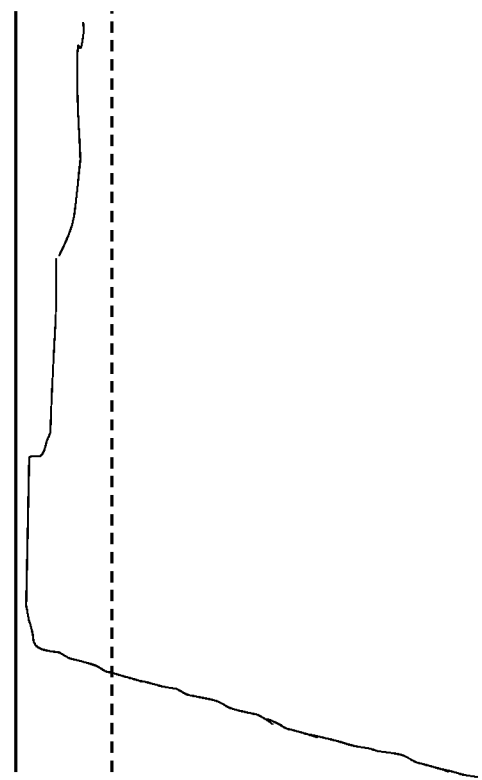
FIGS. 6 and 7 are diagrams that illustrate the effect of changing the comparator threshold.
Figure 6:
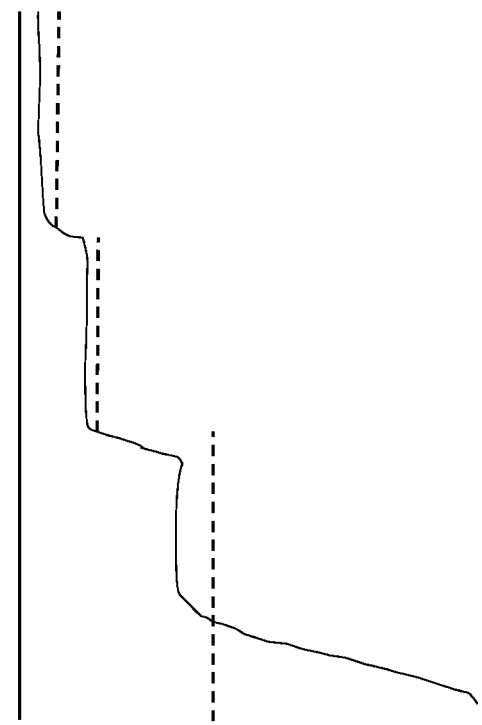

As noted above, such a comparator circuit has the ability to adjust the threshold of the comparator via the "Threshold_adjust" signal fed into the comparator via MN4. FIG. 4 shows a relatively simple arrangement where a single Threshold_adjust signal is provided, to set a single comparator threshold, as shown for example by the horizontal dotted line in FIG. 7. Alternatively, FIG. 5 shows the same comparator circuit, but this time the MN4 device is replaced by a programmable current source which allows adjustment of the gain between the voltage on the Threshold_adjust input and the resulting comparator threshold adjustment. This adjustment can be on a per bit trial or DAC load basis. Ideally, the gain of the programmable current source will be reduced for the final loading of the DAC to ensure that MP3 always turns on for the final DAC load. FIG. 6 shows an example of how the comparator thresholds, indicated by the dashed lines, may be adjusted from bit trial to bit trial. The solid lines show the voltage on the internal reference. The overshoot of the internal reference above the threshold voltage is due to the time delay through the comparator and switch circuit. The final threshold is dynamically adjusted over a number of conversions by the threshold adjustment circuit, so that for the last DAC load the overshoot equals the final threshold voltage and the internal reference voltage 'over-shoots' to the required reference voltage. FIG. 7 shows the potential consequence of not adjusting the threshold voltage during the conversion: The last 2 DAC loads do not trip the comparator circuit and the voltage error on the internal reference gets larger. Further details of this threshold adjusting will be apparent from following description of the whole operation of the circuit.

Given the above circuit arrangements i.e. the circuit of FIG. 2 having the threshold adjust circuit of FIG. 3 and the comparators of FIGS. 4 and 5, FIGS. 8 to 10 and 14 illustrate the operation of the circuit.

Figure 8:
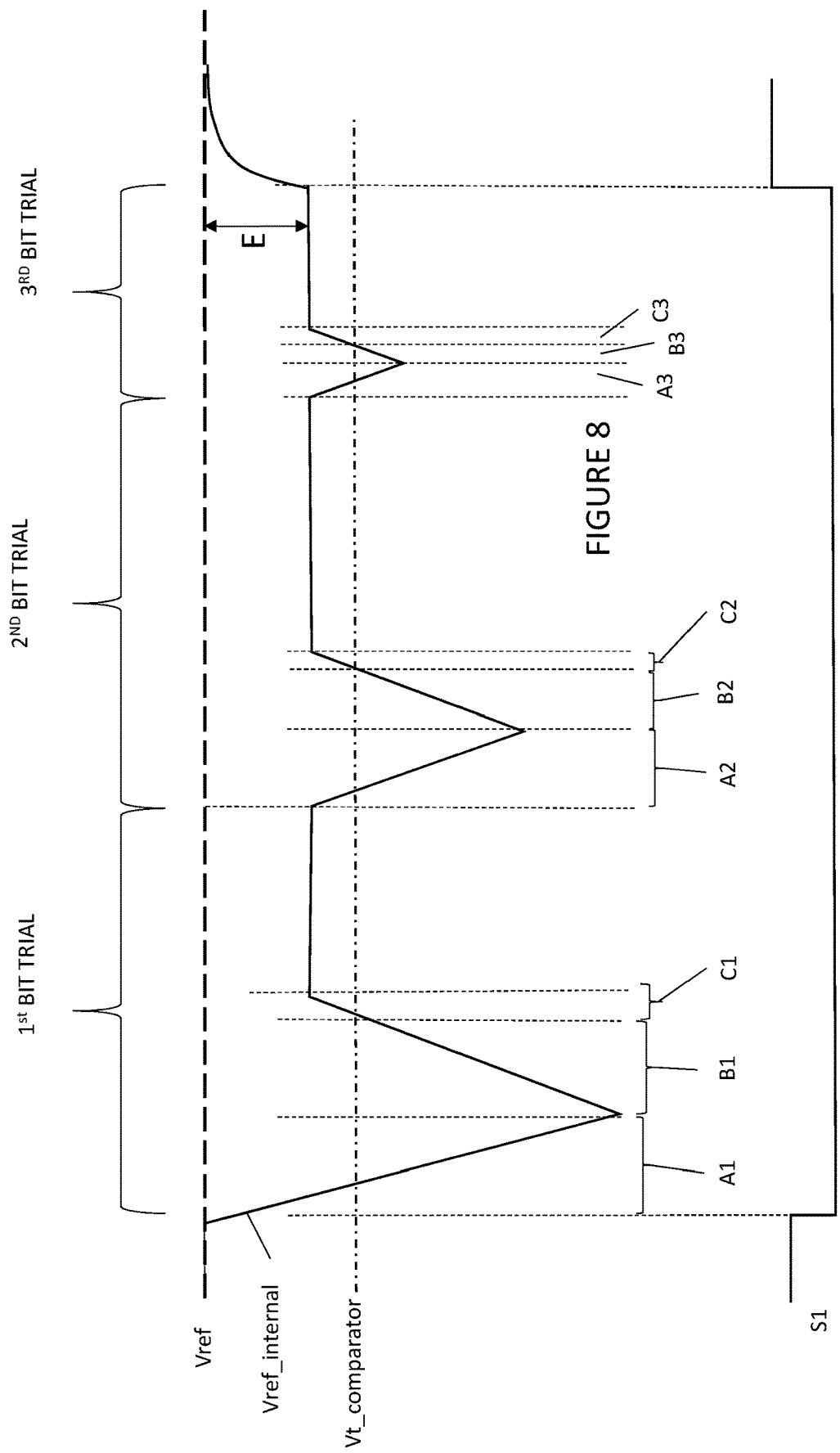
FIG. 8 is a diagram that illustrates the operation of the first example.
Figure 14:
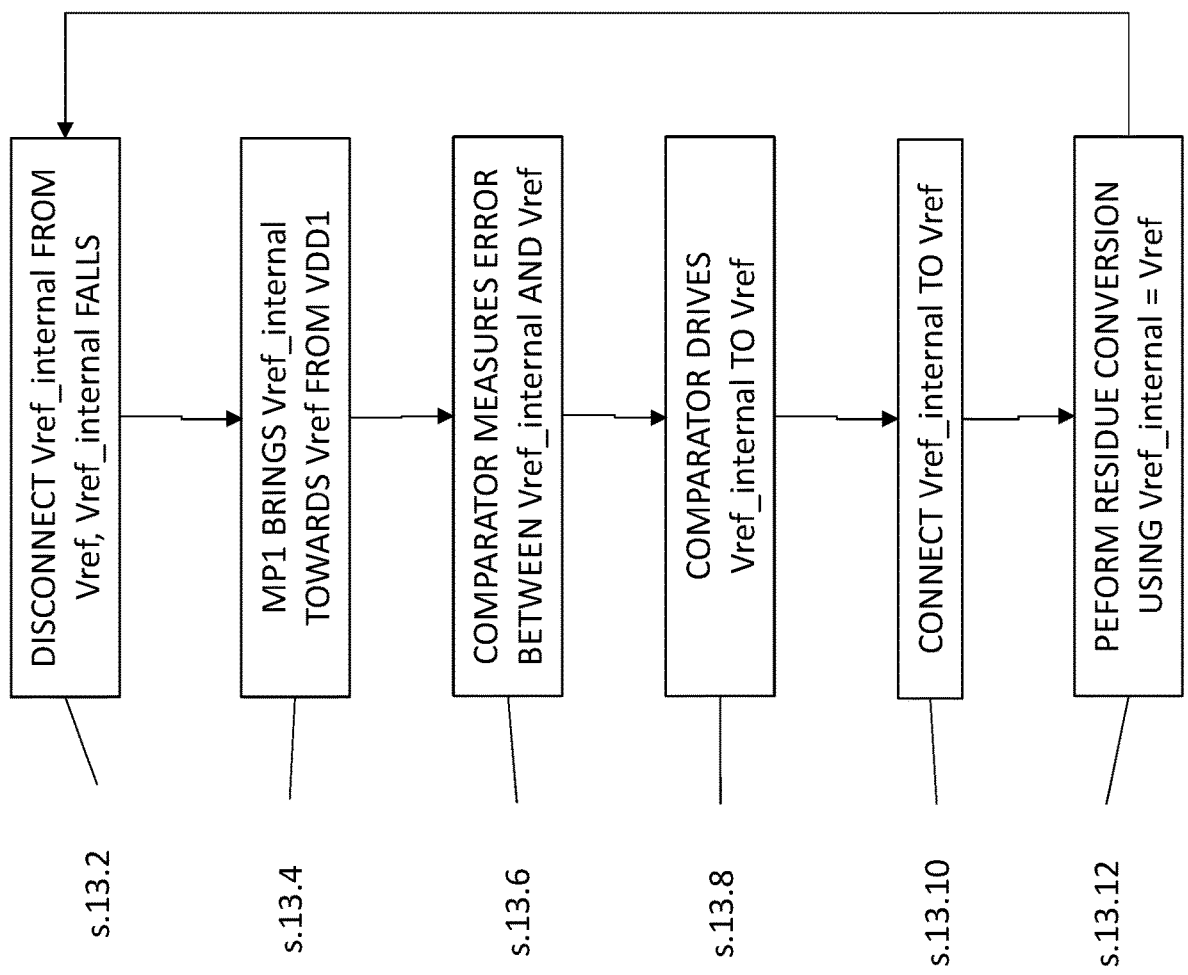
FIG. 14 is a flow diagram illustrating the operation of the first example.

Referring first to FIGS. 2, 8, and 14, the operation of the comparator circuit to bring Vref_internal to Vref over one cycle will be described, without considering threshold adjustment, which will be described further later. In this respect, remember that the purpose of the comparator circuit of FIG. 2 is to bring Vref_internal, which is fed as the reference to DAC1, close to Vref so that when Vref_internal is switched to Vref, the charge taken from Vref is very small, resulting in acceptable error on Vref, even when operating the convertor at high speed. In addition, the control loop for the comparator is of finite bandwidth, and hence the response of the comparator to changes in voltages on its two inputs is not instant, and instead there is a short time delay between changes on the comparator inputs, and a change in the comparator output. However, in the present arrangement this time delay, caused by the finite bandwidth of the comparator, causes some overshoot in the comparator output, but in a determinable fashion which helps to bring Vref_internal closer to Vref.

With the above in mind, consider FIG. 8, which shows how Vref_internal varies with respect to Vref over multiple bit trials undertaken to obtain a single ADC sample. At the start of a sample generation cycle Vref_internal is at Vref having been connected to Vref from the previous sample. The bit trial cycles then start, with the first step being that Vref_internal is disconnected from Vref by turning off switch S1 (s.13.2 of FIG. 14) i.e. the "sample" switch of FIG. 1. On the first data load of DAC1, with S1 switched off, Vref_internal falls to be further away from Vref, as shown by period A1 in FIG. 8. As Vref_internal falls the difference between Vref and Vref_internal increases, until the increase is larger than the threshold Vt_comparator set for the comparator, and the comparator then starts to output a signal. However, due to the limited bandwidth of the comparator loop, there is some time delay between the comparator threshold voltage being passed and the output of the comparator starting to increase, hence period A1 extends beyond the point in time when Vref_internal reaches Vt_comparator.

Due to the difference between Vref_internal and Vref, the comparator output increases, turning on MP1 so that VDD1 starts to supply current to bring Vref_internal back up. As a result, Vref_internal stops falling and starts to rise back up towards Vref, as shown in period B1 in FIG. 8, and s.13.4 of FIG. 14. MP1 is kept turned on by the output of the comparator and hence Vref_internal is kept being brought up towards Vref until the point that the difference between Vref_internal and Vref is then again within the threshold voltage of the comparator, which in FIG. 8 occurs at the end of period B1. However, as mentioned previously because the control loop for the comparator is of finite bandwidth, there will be a finite amount of time during which the comparator continues to output an ON signal to switch MP1, which is shown as time period C1 in FIG. 8. During this time period the Vref_internal signal continues to move towards the Vref signal level, and hence the Vref_internal signal will always move closer to the Vref signal than the threshold Vt_comparator. By appropriate selection of the threshold voltage, therefore, it is possible to exploit the finite loop bandwidth of the comparator to have the Vref_internal signal come to rest at almost exactly Vref, as will be explained later.

Returning to FIG. 8, however, at the start of the next bit trial ($2^{nd}$ bit trial), Vref_internal will again fall, during period A2, and is then again brought back up towards Vref by the comparator controlling MP1 during period B2. Again however, due to the finite bandwidth of the comparator control loop there is some overshoot during time C2, with the result that Vref_internal ends up closer to Vref than Vt_comparator. In this example, the same result is obtained during the $3^{rd}$ bit trial, because the threshold Vt_comparator is constant. At the end of the bit trials (assuming there are three, but there could be more), switch S1 is turned back on, and the residual error E in this case between Vref_internal and Vref is then compensated to bring Vref_internal up to Vref by drawing current from the external Vref via switch S1.

In the above example of FIG. 8, therefore, there remained a residual error E that has to be compensated from Vref.

Figure 9:
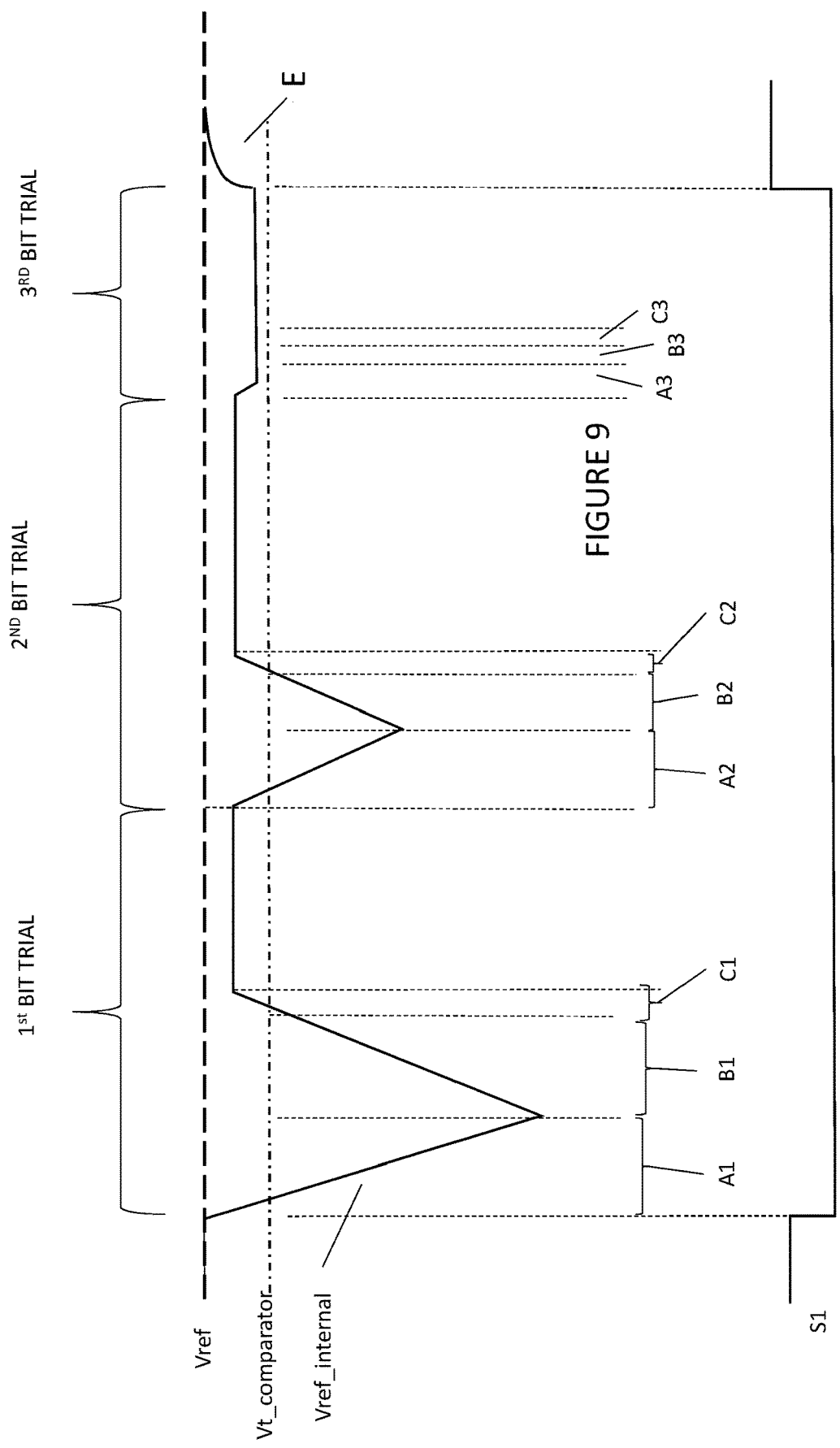
FIG. 9 is a diagram that illustrates the operation of the first example when the threshold is not fully adjusted.
Figure 10:
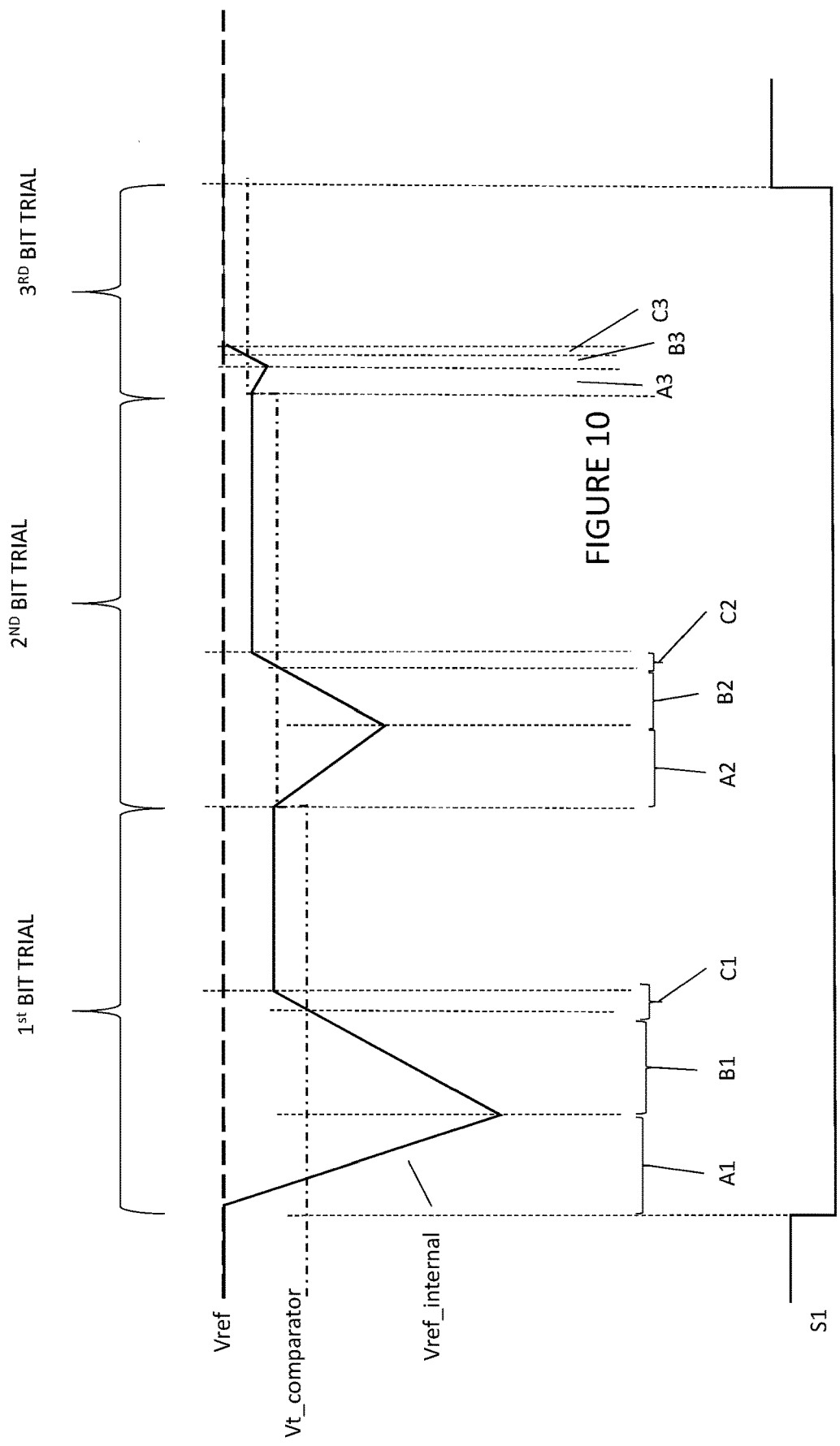
FIG. 10 is a diagram that illustrates the operation of the first example when the threshold is adjusted fully between bit trials.

However, it should be seen from the above that if the threshold Vt_comparator is set appropriately for each bit trial, then the residual error E at the end of the bit trials can be minimised. FIGS. 9 and 10 illustrate this further.

Consider first FIG. 9. This shows the situation where again a fixed threshold Vt_comparator has been used, and here three bit trial or DAC load cycles are again shown, with Vref_internal being brought up to Vref by the comparator circuit of FIG. 2. For the first two cycles the differences to Vref at which Vref_internal settles out are sufficiently large that they are greater than the threshold voltage Vt_comparator, and hence the comparator and switch operates to bring Vref_internal further towards Vref, and to then overshoot. However, in this case for the third bit trial Vref_internal does not fall to less than the threshold of the comparator, and hence the comparator does not operate to bring Vref_internal towards Vref, as shown. In this case, when S1 is turned on to connect Vref_internal to Vref then more charge will need to be taken from Vref and C1 to bring Vref_internal up to Vref, resulting an error voltage on Vref.

In order to address this issue, and as noted previously, the threshold of the comparator can be adjusted from bit trial to bit trial so that it is always less than the possible error between Vref_internal and Vref. Adjustment of the threshold on a per bit trial or per DAC load basis is shown in FIG. 10, where it can be seen that the comparator threshold Vt_comparator is adjusted so that it is always less than the possible error on Vref_internal. By making this adjustment of the comparator threshold the comparator will always help to drive Vref_internal towards Vref for every bit trial. In particular, for the third bit trial the threshold has been adjusted to be very close to, but still below, Vref. This ensures the fall in Vref_internal caused by the third bit trial is still larger than the comparator threshold so that the comparator causes MP1 to turn on, but also ensures that the overshoot of the Vref_internal past the threshold voltage due to the finite comparator control loop bandwidth does not raise Vref_internal to be higher than Vref, but instead that it causes Vref_internal to be at Vref. As noted previously, with Vref_internal at Vref no charge needs to pass from Vref when the sample switch of FIG. 1 closes.

Regarding how the threshold is adjusted, and returning to FIG. 3, the "sample" switch goes from high to low just prior to closing the switch S1 between Vref_internal and Vref. This effectively samples Vref_internal on C1 just before it is switched to connect to Vref, and hence Vref_internal at that point is equal to the sum of Vref plus some error voltage E (e.g. E1 . . . En). When S1 closes (turns on) Vref_internal moves to Vref, and the error E on Vref_internal is transferred to the bottom plate of C1. The "dump" switch then turns on and this transfers the charge E.C1 to C2. The amplifier Amp1 with C2 connected in feedback around it act as an integrator and keeps a running sum of the error E on Vref_internal. The resulting Threshold_adjust control signal therefore adjusts from error to error (E1 . . . En), with the aim of making the error running sum equal to zero over multiple conversions.

Alternative arrangements for the above described threshold adjust circuit could also be used. For example, a digital implementation can be obtained by using an ADC to measure the error voltage E after it has passed through the "dump" switch, and then have a digital integrator to sum the error voltages. A DAC would then be used to generate the "Threshold_adjust" control signal from the digital integrator output. An alternative digital implementation would be to use a 1 bit sigma delta and use the error signal from it as the Threshold_adjust signal.

Figure 11:
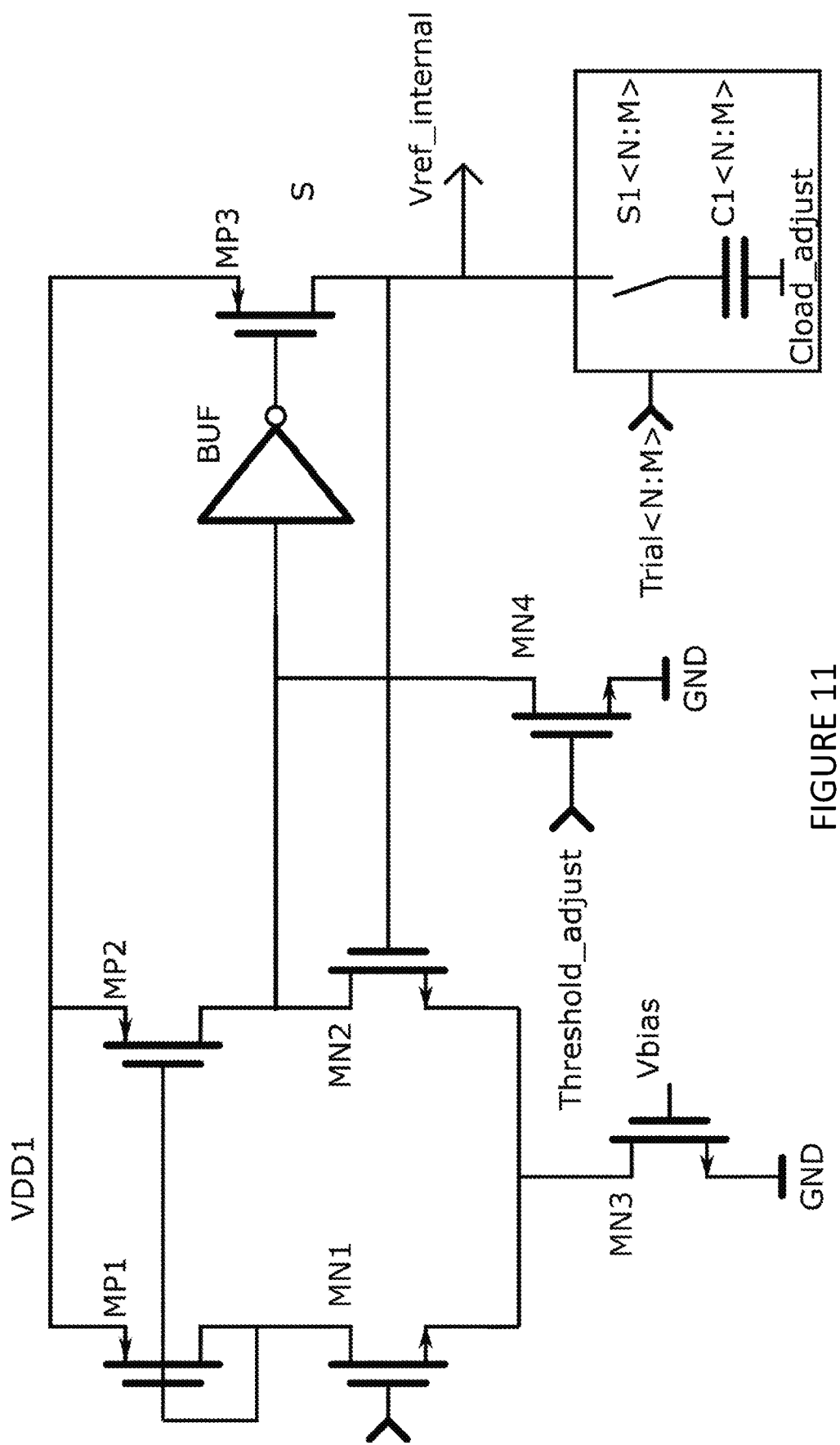
FIG. 11 is a circuit diagram that illustrates how the capacitive loading of the internal reference may also be adjusted between bit trials.

Turning now to FIG. 11, this demonstrates a further optimization to allow the described technique to work to full accuracy. A shown in FIG. 2, a large 100 pF capacitor C1 is connected to Vref_internal next to DAC1. This large 100 pF capacitor makes the task of loading the DAC very simple, as it avoids the risk of top plate nodes going outside the rails. It also makes the capacitance on the Vref_internal nodes almost constant. However, for the described technique to work to full accuracy the capacitance on Vref_internal has to be fixed when the "sample" switch in FIG. 1 goes high. In order to obtain this fixed capacitance, an additional block Cload_adjust is provided which comprises a number of selectable capacitors with attendant controllable switches, so that a particular value capacitor can be switched in per bit trial. The Cload_adjust block acts to modify the capacitance on Vref_internal dependent on the data loaded in to DAC1, and in particular selects a capacitance value (when required—for some values of CDAC then no adjustment may be required) to switch in as Cload so that the sum of CDAC (i.e. the DAC capacitance including the 100 pF capacitor C1)+Cload_adjust is constant. The threshold adjust circuit of FIG. 3 integrates the vref_internal errors (E1 . . . En) when the sample switch of FIG. 1 closes and forces the sum of these voltage errors to zero over time. If the capacitance is constant then forcing the sum of voltage errors to zero also forces the sum of charge errors (Q1 . . . Qn), pulled from Vref, to zero.

Figure 12:
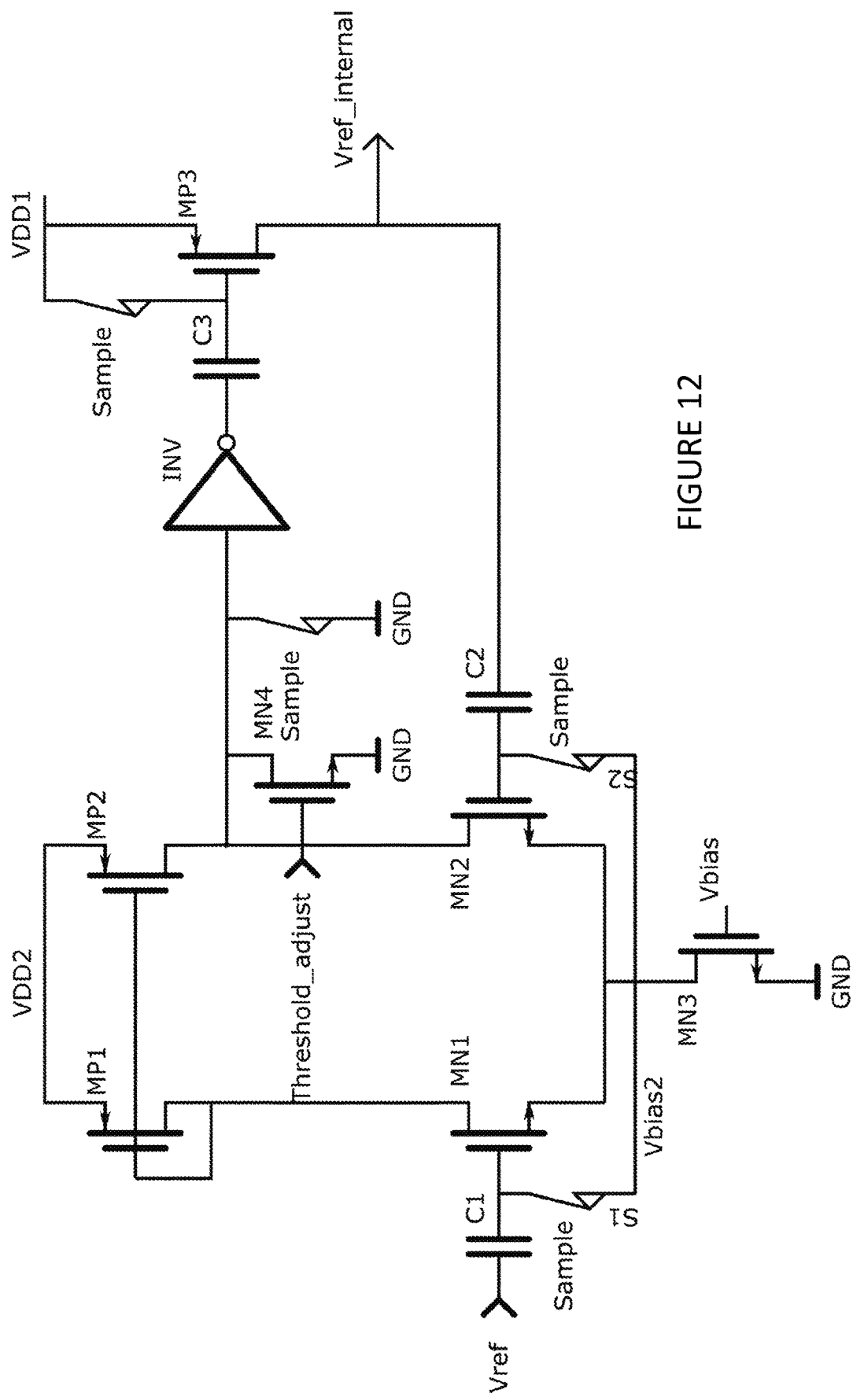
FIG. 12 is a circuit diagram illustrating that the comparator may operate at a different, lower, voltage than the rest of the circuitry.

Referring next to FIG. 12, this illustrates a power saving arrangement, where capacitors C1 to C3 plus switches S1 and S2 allow the comparator circuit to be DC isolated from the remainder of the circuit so that it can operate at a lower supply voltage VDD2 than VDD1, where VDD2 is less than VDD1. Specifically, the provision of the capacitors C1 to C3 provides the DC isolation of the comparator, whilst the switches S1 and S2 that connected to a further internal reference Vbias2, provide for DC level shifting to allow the comparator to operate at lower voltages than the remainder of the circuit. This allows the whole overall arrangement to save power. It should be noted that the operation of this circuit removes the requirement for a precise voltage on the Vref input to this circuit, instead the requirement is that Vref should be a stable voltage. The input Vref could, for example, be connected to VDD.

Figure 13:
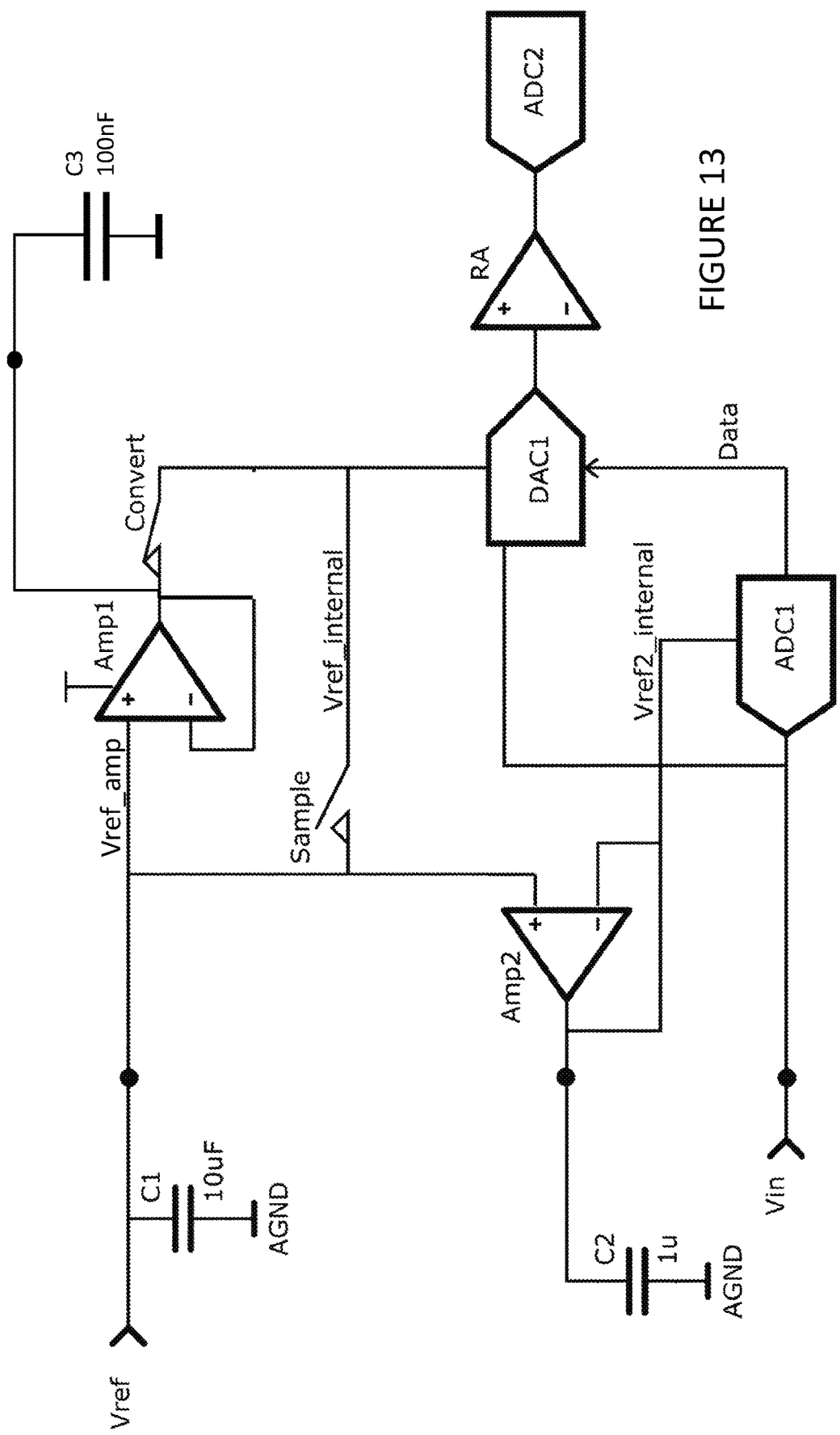
FIG. 13 is a circuit diagram of a second example of the present disclosure that uses a further capacitor connected to the internal reference, and a slower amplifier.

FIG. 13 illustrates an alternative second example of the present disclosure. As noted previously, it is based on the arrangement of FIG. 1, described previously, but replaces the fast amplifier Amp1 with a slower, lower bandwidth amplifier that is easier to implement and has less chip area and power requirements. However, in order to accommodate the lesser performance of the amplifier in bringing Vref_internal up to Vref a large (circa 100 nF) capacitor C3 is provided on the output of the amplifier to help the amplifier provide charge to bring Vref_internal to Vref. In operation, when Vref_internal is disconnected from Vref (i.e. the "sample" switch opens) then the slow amplifier helps to bring it back to Vref, aided by charge from C3, which has been charged to Vref. In this respect, C3 acts as a battery capacitor at Vref, to help bring and maintain the Vref_internal node to Vref. During the sampling phase when the "sample" switch is closed and the "convert" switch at the output of Amp1 is open, the slow amplifier Amp1 acts to re-charge C3 back to Vref, by replacing any charge that was depleted from it during the "convert" phase when it is connected to Vref_internal.

Concerning the circuit design of the lower bandwidth amplifier, various low bandwidth amplifiers are suitable, and one such amplifier which can be used is the reference buffer amplifier described in U.S. Pat. No. 5,854,574 A, the entire contents of which are incorporated herein by reference.

Figure 15:
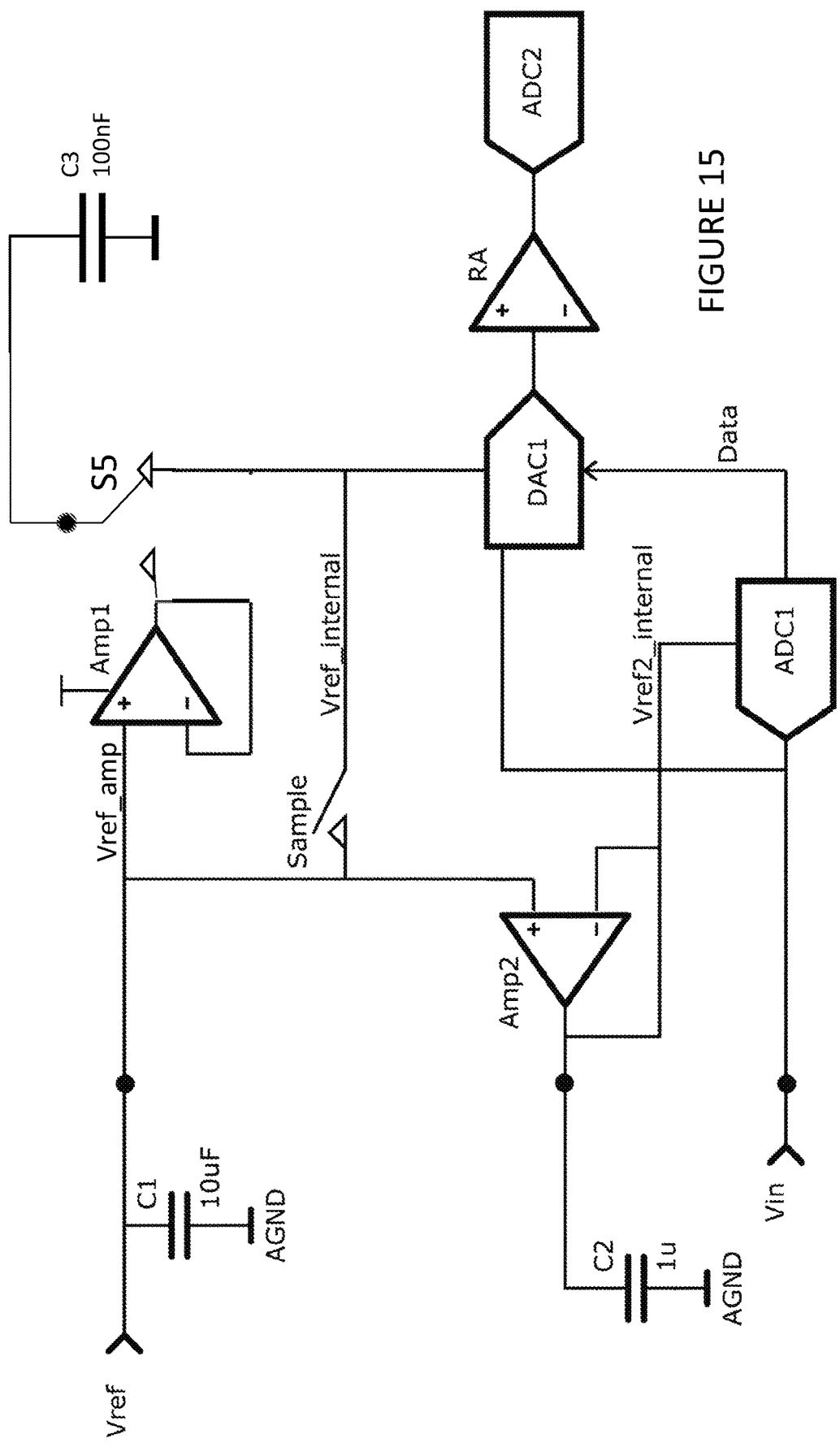
FIG. 15 is a circuit diagram of a third example of the present disclosure that uses a further capacitor connected to the internal reference, and a slower amplifier.

FIG. 15 shows a further alternative example, similar to the example of FIG. 13. Here again a large battery capacitor C3 is provided, and AMP1 is the slower, lower bandwidth amplifier that is easier to implement and has less chip area and power requirements, such as the reference buffer amplifier from U.S. Pat. No. 5,854,574A. However, instead of the output of AMP1 being switched so that it provides charge to the reference input of DAC1, switch S5 is provided that switches the output of AMP1 to charge the battery capacitor C3, but that also switches the battery capacitor C3 so as to supply charge to the DAC1 reference input, at the same time switching the output of AMP1 out of circuit. That is, in other words, S5 switches battery capacitor C3 between two phases of operation; a first phase (shown in FIG. 15), where the "Sample" switch is open and the switch S5 switches the battery capacitor so that it is supplying charge to the internal reference of DAC1 to maintain Verf_internal at or near to Vref, and a second phase (just prior to and during residue generation), where the "Sample" switch is closed such that Vref_internal is connected to Vref for residue generation), and S5 connects capacitor C3 to AMP1 for recharging back to Vref.

With such an arrangement the internal reference of DAC1 is being sustained at or near to Vref for some periods of the conversion cycle corresponding to the first phase solely by the charge stored in capacitor C3, which of course will deplete. However, in many implementations of the ADC for which the present arrangement is envisaged for use, the duty cycle of when the internal DAC reference is fed from C3 (during the first phase) versus when it is fed from the external Vref (during the second phase) is such that the first phase is often commonly much shorter than the second phase, meaning that the capacitor C3 supplies charge to the DAC1 internal reference for much shorter periods than C3 is then being charged by AMP1. One typical example duty cycle would be for a 25 ns conversion to conversion cycle S1 may typically be closed for 18 ns of that time (with DAC1 then being fed the external Vref), meaning that S5 is switched to receive the output of AMP1 for that same time. That would then leave 7 nS of the duty cycle where S5 is switched to supply Vref_internal from capacitor C3, and the Sample switch is open.

Both the arrangements of FIGS. 13 and 15 provide simple alternative solutions to the problem of providing a fast amplifier for provision of a fast settling reference to an ADC, but is possible only where there is chip space for or external pin access to the large battery capacitor C3.

While it is often convenient for the reference input to the comparator Vref_comp or to the low power amplifier Vref_amp to be connected to the reference input Vref, this is not strictly necessary. For example, in other examples these references could be generated by an on-chip voltage reference. What is more, in such cases the Voltage reference output does not need to be the same value as the external reference Vref, as will be apparent from the following further examples of the disclosure, shown in FIGS. 16 and 17. In these examples, a different reference voltage level is used, which is then adjusted to approximately Vref using appropriate biasing around the amplifier (for the example of FIG. 16) or comparator (for the example of FIG. 17).

Figure 16:
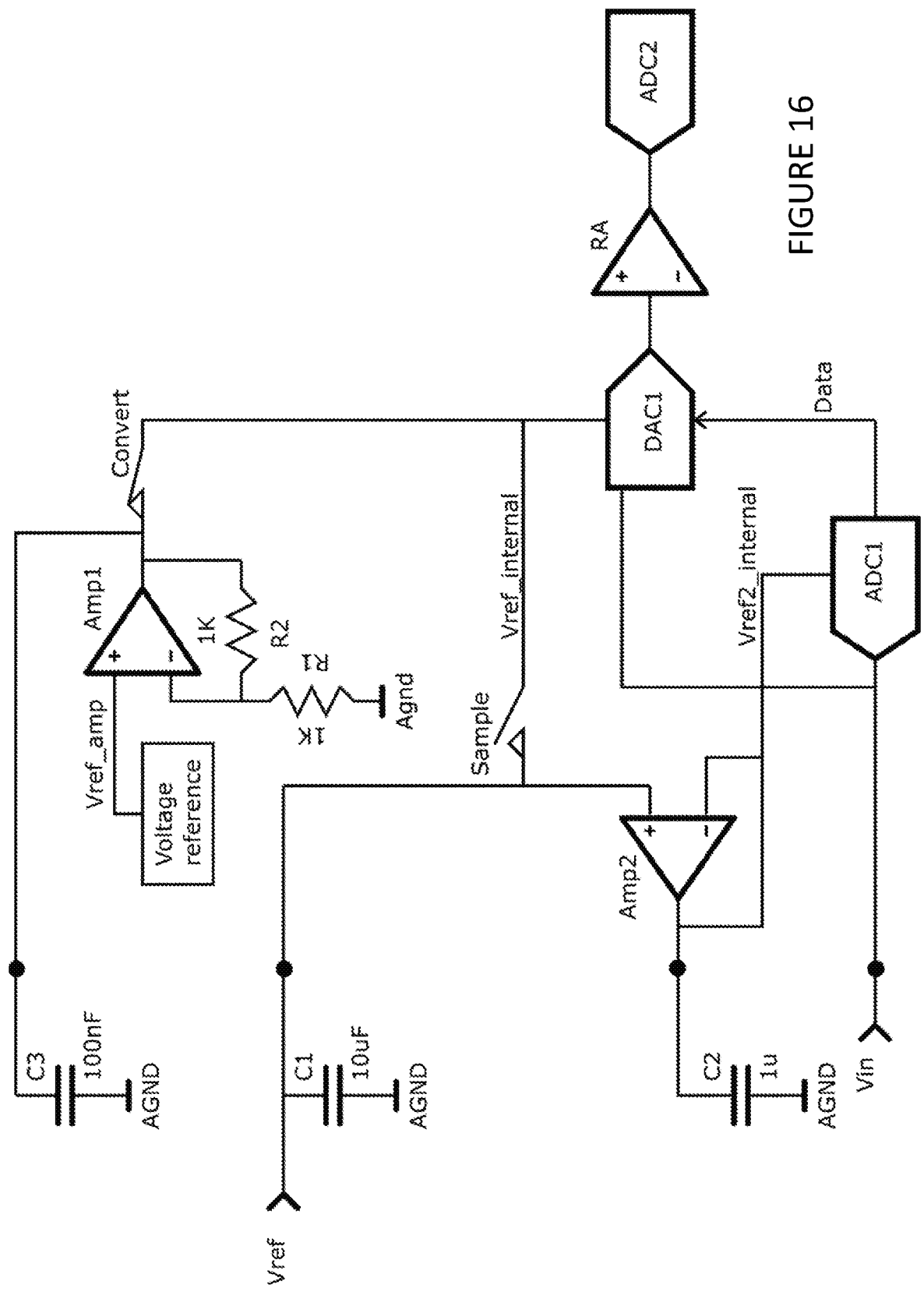
FIG. 16 is a circuit diagram of a fourth example of the present disclosure that uses a different voltage reference (for example an on-chip reference) which is at a different level than a required level.

In the example shown in FIG. 16 (which is related to the examples of FIGS. 13 and 15, in that a low-bandwidth amplifier is used with a capacitor to keep Vref_internal near to Vref), connecting the negative input of AMP2 to the output of the resistor attenuator formed by resistors R1 and R2, results in the output of the amplifier being at a different voltage to the input. In this example, where R1 equals R2, the amplifier output voltage is twice that on Vref_amp. The output of Amp1 would need to be set close to or equal to the voltage on Vref to minimise charge drawn from Vref when the Sample switch closes. The combination of Amp1, the Voltage reference and R1 and R2 could represent a low dropout (LDO) linear regulator. In which case the output of Amp1 would be a regulated supply voltage that may be shared by other circuits while also being used to charge Vref_internal when the Convert switch is closed. The LDO may be co-located on the same die as the ADC but may also be an external component.

Figure 17:
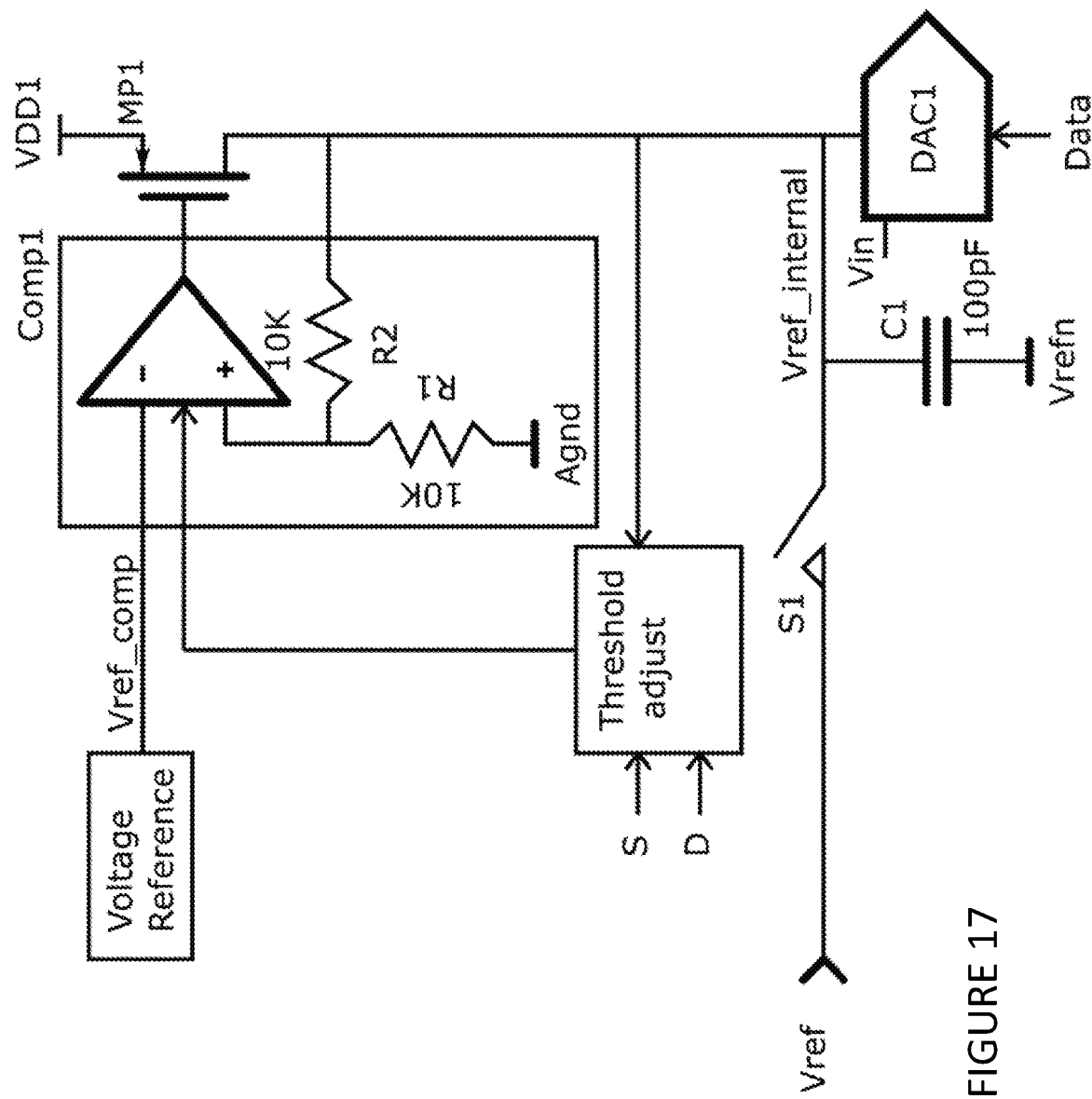
FIG. 17 is a circuit diagram of a fifth example of the present disclosure that also uses a different voltage reference that is at a different voltage level than a required voltage level.

FIG. 17 shows an alternative arrangement, which is related to the example of FIGS. 2 and 3, and which operates in the same or a similar fashion to that example. Similarly, with the arrangement shown in FIG. 17, the resistor attenuator formed by R1 and R2 attenuates the voltage on Vref_internal by a factor of 2, so that the voltage on Vref_internal will be driven by the comparator and switch combination to twice the voltage on Vref_comp. As before (i.e. the circuit of FIGS. 2 and 3), this circuit will need to drive Vref_internal to close to the voltage on Vref while Vref_internal is disconnected from Vref.

Various modifications, whether by way of addition, deletion, or substitution may be made to the above mentioned examples to provide further examples, any and all of which are intended to be encompassed by the appended claims.

What is claimed is:

1. An integrated voltage reference supply circuit for an analog to digital converter (ADC), the voltage reference supply circuit comprising:
   a voltage reference signal input node to receive a voltage reference signal Vref;
   a comparator configured to produce a difference control signal in response to an indication of Vref at a first comparator input and an indication. at a second comparator input, of an internal voltage reference signal Vref internal at an internal voltage reference node that is coupled to a reference input of a digital-to-analog converter (DAC) of the ADC;
   a controllable switch, via which the internal voltage reference node is charged from a supply voltage node in response to the difference control signal; and
   switching circuitry arranged to selectively couple the internal voltage reference node to the voltage reference signal input node to directly receive the voltage reference signal Vref;
   wherein the switching circuitry is controlled to operate in a first phase to disconnect the internal voltage reference node from the voltage reference signal input node and in which the internal voltage reference node is charged from the supply voltage node via the controllable switch; and
   wherein the switching circuitry is controlled to then operate in a second phase to connect the internal voltage reference node to the voltage reference signal input node for use as a reference signal by the ADC.

2. The circuit of claim 1, comprising comparator threshold control circuitry arranged to controllably adjust a comparator threshold of the comparator to compensate for charge drawn from the voltage reference signal input node due to an error signal difference between the internal voltage reference node and the voltage reference signal input node.

3. The circuit of claim 2, wherein the comparator threshold control circuitry comprises integrator circuitry arranged to generate a comparator threshold control signal based upon an integration of the error signal.

4. The circuit of claim 3, wherein the integrator circuitry comprises an integrating amplifier with a first capacitor connected in feedback, and wherein the comparator threshold control circuitry comprises a second capacitor having a first terminal tracking an indication the error signal, the second capacitor having a second terminal switchably couplable to an input of the integrating amplifier for use in generating the comparator threshold control signal based upon the indication of the error signal.

5. The circuit of claim 2, comprising an analog-to-digital converter to measure an indication of the error signal, a digital integrator to accumulate the error signal over time, and a digital-to-analog converter arranged to generate the comparator threshold control signal using an indication of the accumulated error signal provided by an output of the digital integrator.

6. The circuit of claim 2, wherein the comparator threshold is capable of being adjusted from at least one of: bit trial to bit trial of the ADC; or DAC load to DAC load of the DAC of the ADC.

7. The circuit of claim 2, wherein the comparator comprises a differential amplifier, arranged to receive an input signal adapted by the comparator threshold control circuitry.

8. The circuit of claim 1, comprising a capacitive load adjustment circuit arranged to maintain consistency of the capacitance at the internal voltage reference node before reconnecting the internal voltage reference node to the voltage reference signal input node.

9. The signal of claim 8, wherein the capacitive load adjustment circuit comprises individual capacitors that are selectively coupled to the internal voltage reference node based on data to be loaded into the DAC to maintain consistency of the capacitance at the internal voltage reference node.

10. The circuit of claim 1, wherein the comparator comprises a differential amplifier.

11. The circuit of claim 1, comprising one or more isolation capacitors arranged to level-shift a corresponding input or output of the comparator, and wherein the comparator operates from a different supply node than the supply node charging the internal voltage reference node via the controllable switch.

12. An integrated voltage reference supply circuit for an analog to digital converter (ADC), the voltage reference supply circuit comprising;
 an voltage reference signal input node to receive a voltage reference signal Vref;
 a capacitor;
 an amplifier, including a first input to receive an indication of the voltage reference signal, and to output a voltage to the capacitor; and
 switching circuitry arranged to switch selectively an internal voltage reference node between the voltage reference signal input node and the capacitor;
 wherein the switching circuitry is controlled to provide a first phase to disconnect the internal voltage reference node from the voltage reference signal input node and to connect the internal voltage reference node to the capacitor, and then to provide a second phase to connect the internal voltage reference node to the voltage reference signal input node and to disconnect the internal voltage reference node from the capacitor to permit the amplifier to recharge the capacitor.

13. The circuit of claim 12, wherein the capacitor is located off-chip from the amplifier.

14. The circuit of claim 12, wherein a bandwidth of the amplifier is limited in accordance with replacing depleted charge on the capacitor during convert phase of the converter.

15. A method of providing a voltage reference signal for an analog to digital converter (ADC), the method comprising;
 receiving a voltage reference signal Vref at a voltage reference signal input node;
 generating a difference control signal based on comparing Vref to a signal at an internal voltage reference node to a digital-to-analog converter (DAC) of the ADC; and
 receiving the difference control signal to control a controllable switch via which the internal reference voltage node is charged toward Vref by being selectively supplied with charge from a first supply node; and
 wherein the comparing and generating are subject to a time delay therebetween to permit a signal at the internal voltage reference node to be brought substantially to Vref.

16. The method of claim 15, wherein the comparing uses an adjustable threshold to provide the time delay.

17. The method of claim 16. further comprising adjusting the threshold between successive bit trials or DAC loads.

18. The method of claim 16, comprising adjusting the threshold based upon integrating or otherwise accumulating an indication of error between signals at the internal voltage reference node and the voltage reference signal input node.

19. The method of claim 18, comprising adjusting the threshold adaptively over multiple conversion cycles of the ADC.

20. The method of claim 15, comprising adjusting a capacitance at the internal reference voltage node to be substantially constant during an ADC operating phase and, from ADC conversion to ADC conversion, using a capacitive load adjustment based on data to be loaded into a component of the ADC.

21. A method of providing a voltage reference signal for an analog to digital converter (ADC), the method comprising:
 receiving a voltage reference signal Vref at a voltage reference signal input node;
 charging a capacitor toward Vref based on an indication of Vref; and
 switching selectively an internal voltage reference node between the voltage reference signal input node and the capacitor, including providing a first phase to disconnect the internal voltage reference node from the voltage reference signal input node and to connect the internal voltage reference node to the capacitor, and then providing a second phase to connect the internal voltage reference node to the voltage reference signal input node and to disconnect the internal voltage reference node from the capacitor to recharge the capacitor.

22. The method of claim 21., comprising charging the capacitor toward Vref includes controlling a switch between a first supply node and the capacitor using a control signal that is based upon the indication of Vref and an indication of the voltage on the capacitor.

23. The method of claim 22, comprising generating the control signal using an amplifier.

24. The method of claim 23, wherein the amplifier includes a comparator.

25. The method of claim 24, comprising adjusting a threshold of the comparator between successive bit trials or DAC loads.

26. The method of claim 21, comprising generating the indication of Vref including by integrating or otherwise accumulating an indication of error between signals at the internal voltage reference node and the voltage reference signal input node.

27. The method of claim 21, comprising adjusting a capacitance at the internal reference voltage node to be substantially constant during an ADC operating phase and, from ADC conversion to ADC conversion.

\* \* \* \* \*

UNITED STATES PATENT AND TRADEMARK OFFICE
CERTIFICATE OF CORRECTION

PATENT NO. : 10,826,519 B1  
APPLICATION NO. : 16/552610  
DATED : November 3, 2020  
INVENTOR(S) : Hurrell et al.

Page 1 of 1

It is certified that error appears in the above-identified patent and that said Letters Patent is hereby corrected as shown below:

In the Claims

In Column 12, Line 38, in Claim 1, delete "indication." and insert --indication,-- therefor In Column 12, Line 46, in Claim 1, after "circuitry", insert --,--

In Column 13, Line 31, in Claim 9, delete "signal" and insert --circuit-- therefor In Column 13, Line 47, in Claim 12, delete "comprising;" and insert --comprising:-- therefor In Column 14, Line 3, in Claim 14, after "during", insert --a--

In Column 14, Lines 6-7, in Claim 15, delete "comprising;" and insert --comprising:-- therefor In Column 14, Line 23, in Claim 17, delete "claim 16." and insert --claim 16,-- therefor In Column 14, Line 56, in Claim 22, delete "claim 21.," and insert --claim 21,-- therefor In Column 15, Line 5, in Claim 26, delete "node," and insert --node.-- therefor Signed and Sealed this  
Sixteenth Day of February, 2021

Drew Hirshfeld  
*Performing the Functions and Duties of the*  
*Under Secretary of Commerce for Intellectual Property and*  
*Director of the United States Patent and Trademark Office*